United States Patent
Huang et al.

(10) Patent No.: US 6,962,847 B2
(45) Date of Patent: Nov. 8, 2005

(54) METHOD FOR FORMING A SELF-ALIGNED BURIED STRAP IN A VERTICAL MEMORY CELL

(75) Inventors: Cheng-Chih Huang, Taipei (TW);
Sheng-Wei Yang, Taipei (TW);
Neng-Tai Shih, Taipei (TW);
Chen-Chou Huang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/846,321

(22) Filed: May 14, 2004

(65) Prior Publication Data
US 2005/0124111 A1 Jun. 9, 2005

(30) Foreign Application Priority Data
Dec. 5, 2003 (TW) .................................... 92134315 A (51) Int. Cl.[7] ...................... H01L 21/8242; H01L 21/20
(52) U.S. Cl. ...................... 438/249; 438/248; 438/247; 438/244; 438/390; 438/392; 438/391; 438/387
(58) Field of Search ................................ 438/241–249, 438/386–392; 257/301–306

(56) References Cited

U.S. PATENT DOCUMENTS

| | | | | |
|---|---|---|---|---|
| 6,066,527 A | * | 5/2000 | Kudelka et al. | 438/243 |
| 6,281,539 B1 | * | 8/2001 | Mandelman et al. | 257/302 |
| 6,288,422 B1 | * | 9/2001 | Mandelman et al. | 257/301 |
| 6,320,215 B1 | * | 11/2001 | Bronner et al. | 257/301 |
| 6,406,970 B1 | * | 6/2002 | Kudelka et al. | 438/386 |
| 6,426,526 B1 | * | 7/2002 | Divakaruni et al. | 257/302 |
| 6,437,381 B1 | * | 8/2002 | Gruening et al. | 257/296 |
| 6,501,117 B1 | * | 12/2002 | Radens et al. | 257/301 |
| 6,605,504 B1 | * | 8/2003 | JaiPrakash et al. | 438/243 |
| 6,638,815 B1 | * | 10/2003 | Bronner et al. | 438/246 |
| 6,703,274 B1 | * | 3/2004 | Chidambarrao et al. | 438/243 |
| 6,759,702 B2 | * | 7/2004 | Radens et al. | 257/302 |
| 2001/0038113 A1 | * | 11/2001 | Bronner et al. | 257/301 |
| 2002/0090780 A1 | * | 7/2002 | Divakaruni et al. | 438/246 |
| 2002/0149047 A1 | * | 10/2002 | Divakaruni et al. | 257/302 |
| 2003/0218208 A1 | * | 11/2003 | Lin et al. | 257/316 |
| 2004/0029346 A1 | * | 2/2004 | Jaiprakash et al. | 438/268 |

* cited by examiner

Primary Examiner—Jennifer M. Kennedy
(74) Attorney, Agent, or Firm—Quintero Law Office (57) ABSTRACT

A method for forming a self-aligned buried strap in a vertical memory cell. A semiconductor substrate with a trench is provided. A collar dielectric layer is conformally formed on the trench bottom portion, and the trench is filled with a conducting layer. The collar dielectric layer is etched below the level of the surface of the conducting layer to form a groove between the conducting layer and the trench. The groove is filled with a doped conducting layer. The dopant in the doped conducting layer is diffused to the semiconductor substrate in an ion diffusion area as a buried strap. The conducting layer and the doped conducting layer are etched below the ion diffusion area. A top trench insulating layer is formed on the bottom of the trench, wherein the top trench insulating layer is lower than the ion diffusion area.

18 Claims, 7 Drawing Sheets

METHOD FOR FORMING A SELF-ALIGNED BURIED STRAP IN A VERTICAL MEMORY CELL

BACKGROUND OF THE INVENTION

1. Field of the Invention

The invention relates to a memory cell, and more particularly to a method for forming a vertical memory cell with a buried strap aligned with a trench top oxide layer.

2. Description of the Related Art

Memory devices, such as dynamic random access memory (DRAM), for non-volatile storage of information, are currently in widespread use, in a myriad of applications.

A conventional DRAM consists of a transistor and a capacitor, with electrical charges moving in or out of the capacitor during reading or writing. The capacitor normally used is a deep trench capacitor to reduce the size of the memory device. The capacitor is disposed in the deep trench bottom, the transistor is disposed at the deep trench top, and a thin dielectric layer, such as trenchtop oxide (TTO) layer, acting as an electrical insulating layer is disposed between the capacitor and the transistor.

Figure 1:
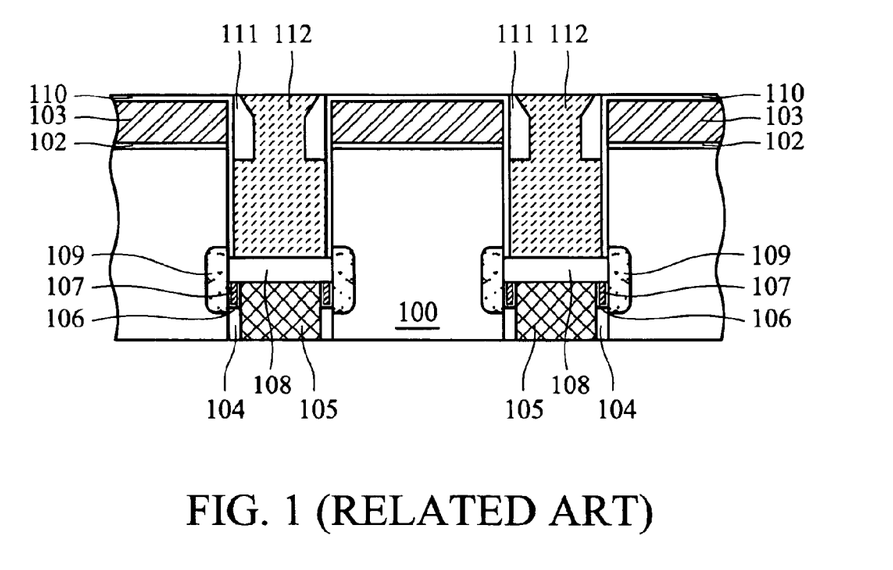
FIG. 1 is a cross-section of a conventional vertical DRAM.

FIG. 1 is a cross-section of a conventional vertical DRAM. The vertical DRAM comprises a semiconductor 100 with a deep trench, in which the deep trench is defined by a mask layer consisting of a pad oxide layer 102 and a nitride layer 103. A capacitor 105 is disposed in the deep trench bottom 105, an oxide layer 104 is formed between the capacitor 105 and the trench, a doped poly layer 107 is formed on the oxide layer 104, and a thin nitride layer 106 is formed between the doped poly layer 107 and the oxide layer 104. A trench top oxide (TTO) layer 108 is formed on the elements to insulate the capacitor 105 and a vertical transistor formed thereon. The doped poly layer 107 is annealed to form an ion diffused area 109 acting as a buried strap and a drain, and disposed in the semiconductor substrate 100 beside the TTO layer 108. After a gate oxide layer 110 and a doped poly layer 112 acting as agate are formed, the DRAM with a vertical channel is complete.

As the ion diffused area 109 covers the semiconductor substrate 100 outside the TTO layer 108 and the doped poly layer 112, when the ion diffused area is increased, ion concentration is lowered, thereby increasing the resistance. As a result, writing and reading currents of the capacitor 105 are affected.

SUMMARY OF THE INVENTION

The present invention is directed to a method for forming a self-aligned buried strap and a vertical memory cell with a self-aligned buried strap.

Accordingly, the present provides a method for forming a self-aligned buried strap. A semiconductor substrate with a trench is provided. A collar dielectric layer is conformably formed on a trench bottom portion. The trench bottom portion surrounded by the collar dielectric layer is filled with a conducting layer. The exposed collar dielectric layer is etched below the level of the surface of the conducting layer, thereby forming a groove between the conducting layer and the trench. The groove is filled with a doped conducting layer. Ions are diffused into the semiconductor substrate from the doped conducting layer to form a diffused area acting as a buried strap. The conducting layer and the doped conducting layer are etched below the top surface of the doped area. A trench top insulating layer is formed on the bottom surface of the trench, wherein the trench top insulating layer is lower than the top of the doped area.

Accordingly, the present invention provides a method for forming a vertical memory cell with a self-aligned buried strap. A semiconductor substrate with a trench is provided. A collar dielectric layer is conformably formed on the semiconductor substrate and the trench. A first conducting layer is formed on the collar dielectric layer, and the trench is filled with the first conducting layer. The first conducting layer is etched to form a second conducting layer in the bottom portion of the trench. The exposed collar dielectric layer is etched below the level of the surface of the second conducting layer, thereby forming a groove between the second conducting layer and the trench. A thin nitride layer is conformably formed on a surface of the trench and the groove. The groove is filled with a doped conducting layer. The semiconductor substrate is heated to diffuse the dopant into the semiconductor substrate from the doped conducting layer to form an ion diffusing area acting as a buried strap. The second conducting layer and the doped conducting layer are etched below the level of the top surface of the ion diffusing area. The exposed thin nitride layer is removed. A trench top insulating layer is formed on the bottom of the trench, wherein the trench top insulating layer is lower than the top of the ion diffusing area. A gate dielectric layer is conformably formed on a sidewall of the trench. A third conducting layer is formed in the trench.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 2a to 2k are cross-sections of the method for forming a vertical DRAM with a self-aligned buried strap of the present invention.

Figure 2A:
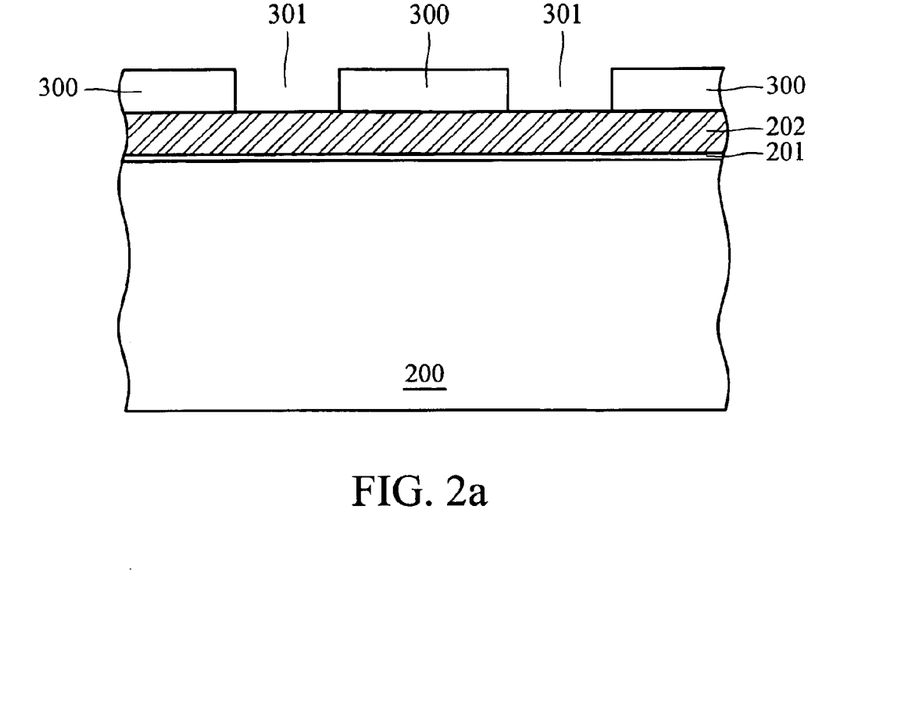
FIGS. 2a to 2k are cross-sections of the method for forming a vertical DRAM with a self-aligned buried strap of the present invention.

In FIG. 2a, a semiconductor substrate 200 is provided, on which a pad oxide layer 201, a pad nitride layer 202, and a patterned hard mask layer 300 having an opening 301 for defining a trench are sequentially formed.

Figure 2B:
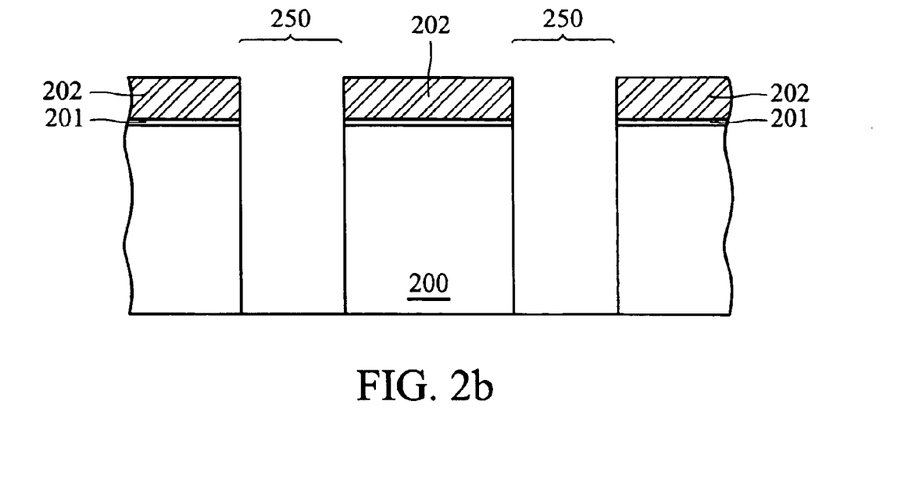

In FIG. 2b, the pad nitride layer 202 and the pad oxide layer 201 are sequentially etched using the patterned hard mask layer 300 as an etching mask to form an opening, and the semiconductor substrate 200 is etched using the pad nitride layer 202 and the pad oxide layer 201 as etching masks to form a trench 250. The trench 250 is deep in the semiconductor substrate 200.

Figure 2C:
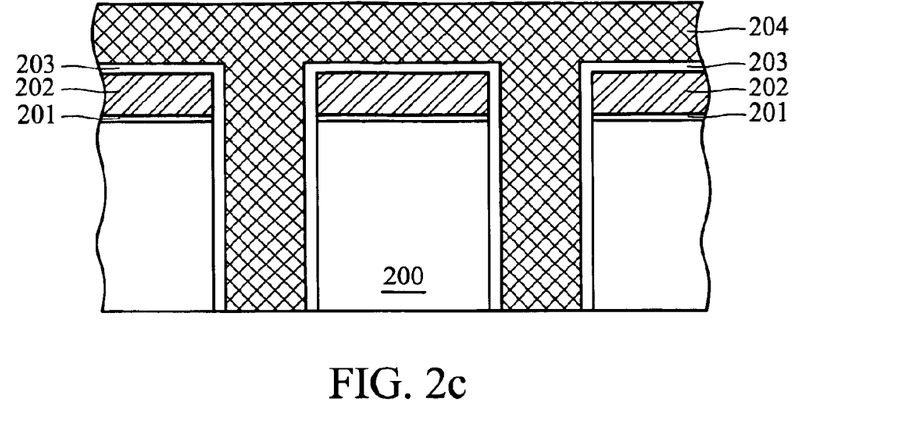

In FIG. 2c, a capacitor is disposed in the bottom of the trench 250, comprising a buried plate, a conformable capacitor dielectric layer, and plate. A collar dielectric layer 203, such as an oxide layer formed by CVD, is formed on a sidewall of the trench 250 above the capacitor. A conducting layer 204, such as a poly layer or epi-silicon layer, is formed on the semiconductor substrate 200, and the trench 250 is filled with the conducting layer 204.

Figure 2D:
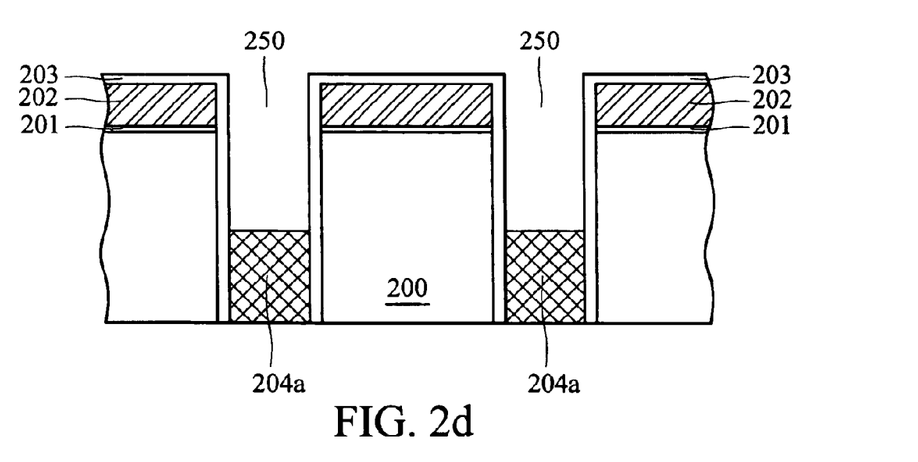

In FIG. 2d, the conducting layer 204 is etched to leave a conducting layer 204a in the trench 250.

Figure 2E:
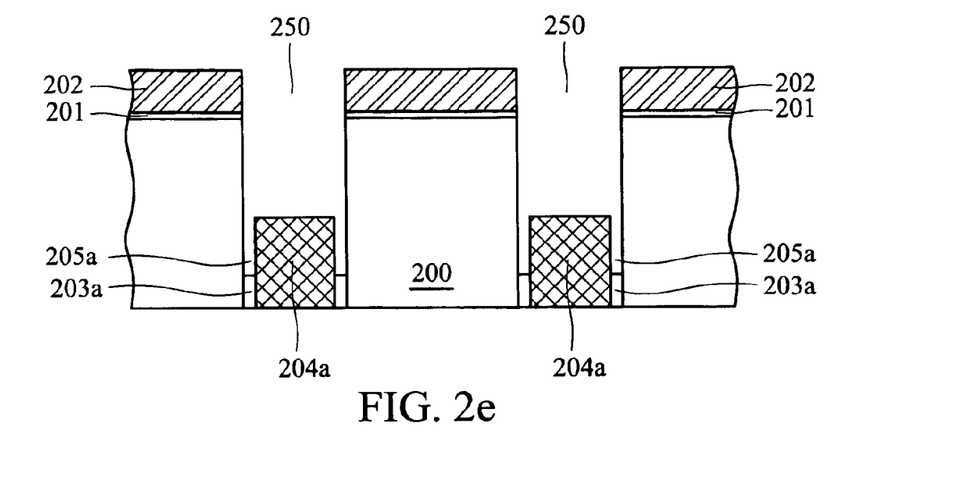

In FIG. 2e, the exposed collar dielectric layer 203 is removed below the conducting layer 204a by 600 to 800 Å, such that a groove 250a is formed. The remaining collar dielectric layer 203a insulates the conducting layer 204a and the semiconductor substrate 200.

Figure 2F:
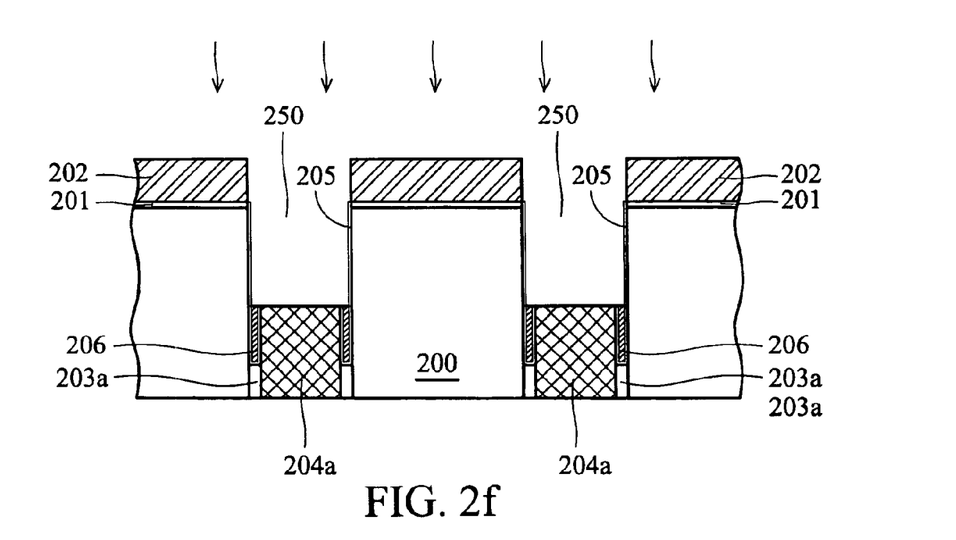

In FIG. 2f, a thin insulating layer, such as a thin nitride layer, is formed by CVD on the surfaces of the conducting layer 204a and the collar dielectric layer 203a, and sidewalls of the trench 250 and the groove 250a. The thickness of the insulating layer is thinner than 10 Å, such as 6 Å, and keeping the diffusion rate low.

The trench 250 is filled with a doped conducting layer, and the doped conducting layer is etched to leave a doped conducting layer 206 in the groove 250a acting as a diffusing source.

Figure 2G:
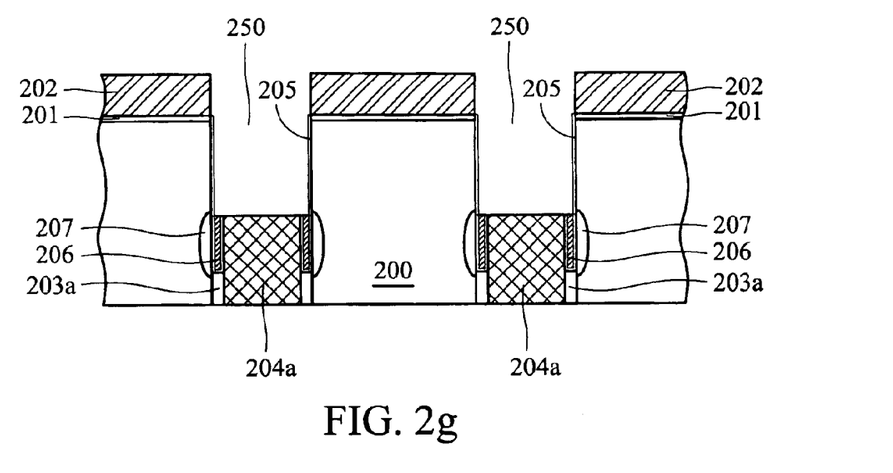

In FIG. 2g, the semiconductor substrate 200 is annealed to form a diffused area 207, acting as a buried strap and a drain, in the semiconductor substrate 200 outside the doped conducting layer 206. The diffused area 207 electrically connects the conducting layer 204a and a transistor.

Figure 2H:
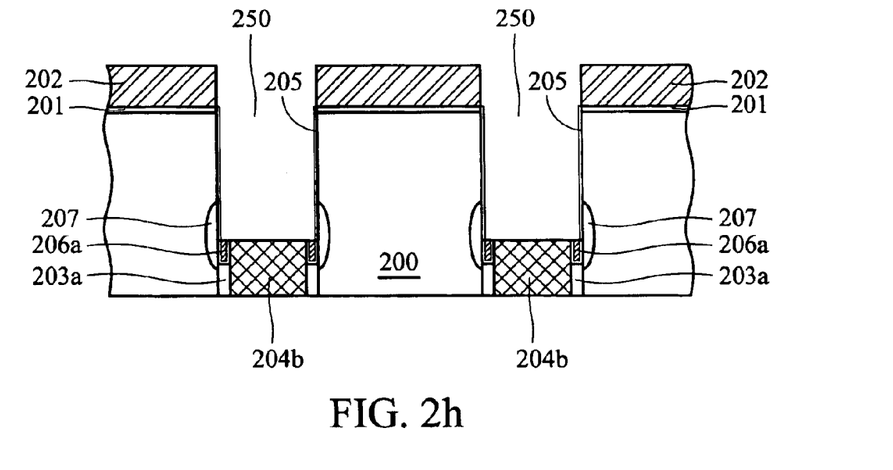

In FIG. 2h, the conducting layer 204a and the doped conducting layer 206 are etched below their surfaces than the diffused are 207 by 400 Å, forming a conducting layer 204b and a doped conducting layer 206a.

Figure 2I:
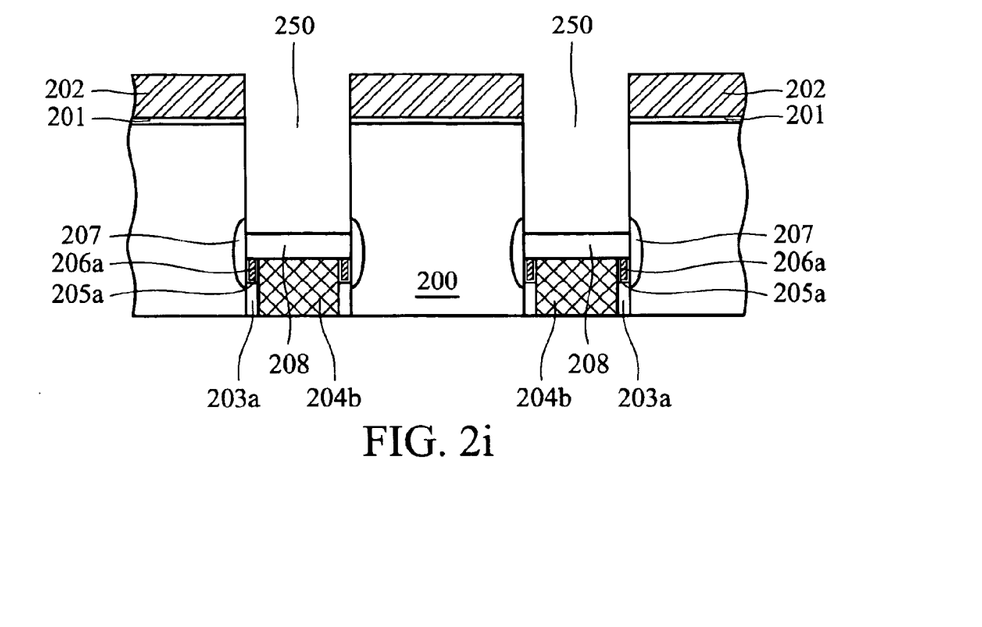

In FIG. 2i, after the exposed thin insulating layer 205 is removed, a trench top insulating layer 209, such as a trench top oxide (TTO) layer, is formed on the conducting layer 204b, the thin insulating layer 205a, and the doped poly layer 206a. The trench top insulating layer 208 is lower than the diffused area 207 by 100 to 400 Å, and insulates the conducting layer 204b and a gate of the transistor formed thereon subsequently.

Figure 2J:
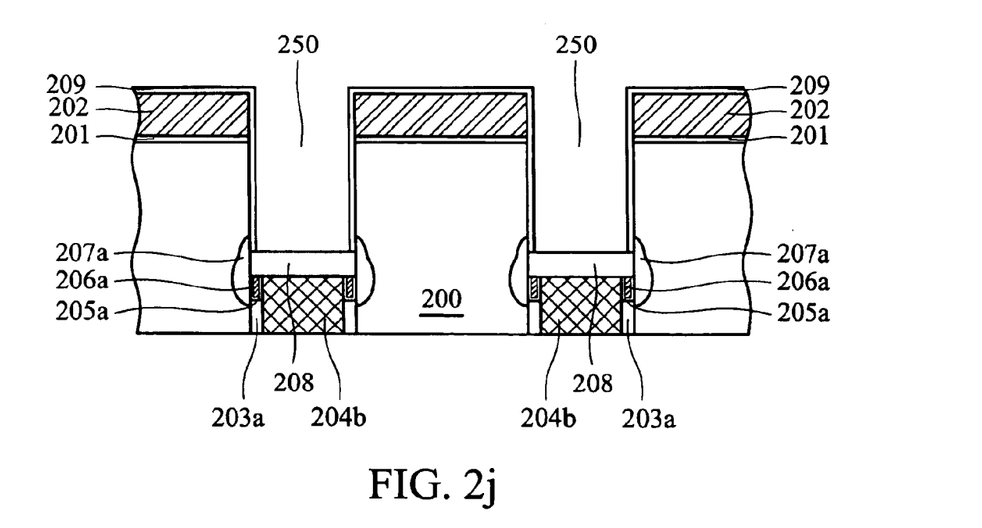

In FIG. 2j, a gate dielectric layer 209, such as a thermal oxide layer about 20 to 60 Å, is formed on the sidewall of the trench 250 and the pad nitride layer 202. At the same time, dopants remaining in the doped conducting layer 206a are diffused into the semiconductor substrate 200 again by thermal oxidation, and a diffused area 207a is formed. The diffused area 207a is large than the diffused area 207, but the concentrations of the diffused area 207a and 207 are similar. Therefore, the resistance of the diffused area 207a does not increase.

Figure 2K:
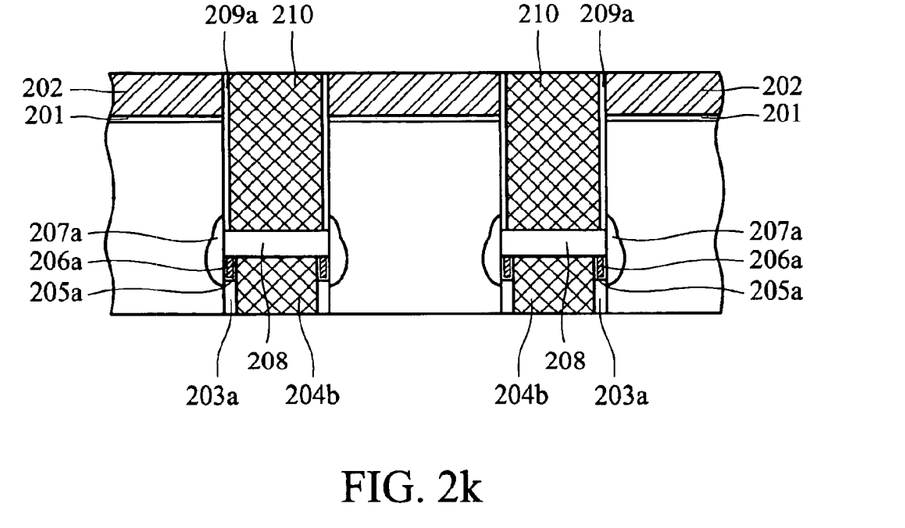

In FIG. 2k, a conducting layer, such as a poly layer or an epi-silicon layer, is formed on the semiconductor substrate 200, and the trench 250 is filled with the conducting layer. The conducting layer and the exposed gate dielectric layer 209 are sequentially planarized to leave a conducting layer 210 acting as a gate and a gate dielectric layer 209a in the trench 250, such that the vertical DRAM with a vertical channel of the present is complete.

The diffused area acting as the buried strap is formed before the trench top insulating layer of the present invention, and the concentration and region of the diffused area can be controlled with the resistance low, such that the buried strap electrical connects to the capacitor and the transistor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a self-aligned buried strap, comprising:

providing a semiconductor substrate with a trench;

conformably forming a collar dielectric layer in a trench bottom portion;

filling a conducting layer in the trench bottom portion surrounded by the collar dielectric layer;

etching the exposed collar dielectric layer below the level of the surface of the conducting layer, thereby forming a groove between the conducting layer and the trench;

forming a thin nitride layer on the groove;

filling a doped conducting layer in the groove;

diffusing ions into the semiconductor substrate from the doped conducting layer to form a doped area acting as a buried strap;

etching the conducting layer and the doped conducting layer below the level of the top surface of the doped area; and forming a trench top insulating layer on the bottom surface of the trench, wherein the trench top insulating layer is lower than the top of the doped area.

2. The method for forming a self-aligned buried strap of claim 1, wherein the collar dielectric layer is an oxide layer.

3. The method for forming a self-aligned buried strap of claim 1, wherein the conducting layer is a poly layer.

4. The method for forming a self-aligned buried strap of claim 1, wherein the doped conducting layer is a doped poly layer.

5. The method for forming a self-aligned buried strap of claim 1, wherein the thin nitride layer is thinner than 10 Å.

6. The method for forming a self-aligned buried strap of claim 1, wherein thickness of the thin nitride layer is 6 Å.

7. The method for forming a self-aligned buried strap of claim 1, wherein the dopant in the doped conducting layer is As.

8. The method for forming a self-aligned buried strap of claim 1, wherein the trench top insulating layer is a trench top oxide layer.

9. A method for forming a vertical memory cell with a self-aligned buried strap, comprising:

providing a semiconductor substrate with a trench;

conformably forming a collar dielectric layer on the semiconductor substrate and the trench;

forming a first conducting layer on the collar dielectric layer, wherein the trench is filled with the first conducting layer;

etching the first conducting layer to form a second conducting layer in the trench bottom portion;

etching the exposed collar dielectric layer below the level of the surface of the second conducting layer, thereby forming a groove between the second conducting layer and the trench;

conformably forming a thin nitride layer on a surface of the trench and the groove;

filling a doped conducting layer in the groove;

heating the semiconductor substrate to diffuse the dopant into the semiconductor substrate from the doped conducting layer to form an ion diffused area acting as a buried strap;

etching the second conducting layer and the doped conducting layer below the level of the top surface of the ion diffused area to expose the thin nitride layer;

removing the exposed thin nitride layer on the surface of the trench;

forming a trench top insulating layer on the bottom of the trench, wherein the trench top insulating layer is lower than the top of the ion diffused area;

conformably forming a gate dielectric layer on a sidewall of the trench; and forming a third conducting layer in the trench.

10. The method for forming a self-aligned buried strap of claim 9, wherein the collar dielectric layer is an oxide layer.

11. The method for forming a self-aligned buried strap of claim 9, wherein the first conducting layer is a poly layer.

12. The method for forming a self-aligned buried strap of claim 9, wherein the thin nitride layer is thinner than 10 Å.

13. The method for forming a self-aligned buried strap of claim 12, wherein the thin nitride layer is 6 Å.

14. The method for forming a self-aligned buried strap of claim 9, wherein the doped conducting layer is a doped poly layer.

15. The method for forming a self-aligned buried strap of claim 9, wherein the dopant in the doped conducting layer is As.

16. The method for forming a self-aligned buried strap of claim 9, wherein the trench top insulating layer is a trench top oxide layer.

17. The method for forming a self-aligned buried strap of claim 9, wherein the gate dielectric layer is a gate oxide layer.

18. The method for forming a self-aligned buried strap of claim 9, wherein the third conducting layer is a poly layer.

* * * * *